US012750983B2

(12) United States Patent
Ji et al.

(10) Patent No.: US 12,750,983 B2
(45) Date of Patent: Sep. 29, 2026

(54) SERVER AND SERVER LIQUID COOLING SYSTEM

(71) Applicants: Inventec (Pudong) Technology Corporation, Shanghai (CN); INVENTEC CORPORATION, Taipei (TW)

(72) Inventors: Jiaqing Ji, Shanghai (CN); Jiangjun Wu, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 261 days.

(21) Appl. No.: 18/752,778

(22) Filed: Jun. 24, 2024

(65) Prior Publication Data

US 2025/0351308 A1 Nov. 13, 2025

(30) Foreign Application Priority Data

May 10, 2024 (CN) ........................ 202410580871.9

(51) Int. Cl.
*H05K 7/20* (2006.01)

(52) U.S. Cl.
CPC ..... *H05K 7/20772* (2013.01); *H05K 7/20254* (2013.01); *H05K 7/20263* (2013.01); *H05K 7/20272* (2013.01)

(58) Field of Classification Search
CPC ........... H05K 7/20236; H05K 7/20772; H05K 7/20254; H05K 7/20263; H05K 7/20272; H05K 7/203; G06F 1/20
See application file for complete search history.

(56) References Cited

U.S. PATENT DOCUMENTS

| | | | | |
|---|---|---|---|---|
| 2021/0185850 | A1* | 6/2021 | Kulkarni | H05K 7/20327 |
| 2021/0199384 | A1* | 7/2021 | Minamitani | F28D 9/0062 |
| 2022/0264768 | A1* | 8/2022 | Horng | H05K 7/20327 |
| 2022/0408589 | A1* | 12/2022 | Ji | F28D 1/035 |
| 2024/0324146 | A1* | 9/2024 | Jia | H05K 7/20272 |
| 2024/0381585 | A1* | 11/2024 | Liao | H05K 7/20236 |
| 2025/0021143 | A1* | 1/2025 | Repac | B60W 60/001 |
| 2025/0254825 | A1* | 8/2025 | Lee | H05K 7/20236 |

* cited by examiner

*Primary Examiner* — Jacob R Crum

(57) ABSTRACT

A server and a server liquid cooling system are provided. The server includes a computer case provided with a first liquid cooling cavity, and a first liquid inlet hole and a first liquid outlet hole that are in communication with the first liquid cooling cavity; a high power consumption device and a low power consumption device that are provided in the first liquid cooling cavity; and a cooling plate assembly provided in the first liquid cooling cavity and corresponding to the high power consumption device. The cooling plate assembly is provided with a second liquid cooling cavity, and a second liquid inlet hole and a second liquid outlet hole that are in communication with the second liquid cooling cavity, the second liquid inlet hole is in communication with the first liquid inlet hole, and the second liquid outlet hole is in communication with the first liquid cooling cavity.

19 Claims, 4 Drawing Sheets

SERVER AND SERVER LIQUID COOLING SYSTEM

CROSS-REFERENCE TO RELATED APPLICATIONS

This application claims priority of Chinese Patent Application No. 202410580871.9, filed on May 10, 2024, entitled "SERVER AND SERVER LIQUID COOLING SYSTEM", the entire content of which is incorporated herein in its entirety.

TECHNICAL FIELD

The present disclosure relates to servers, and in particular to a server and a server liquid cooling system.

BACKGROUND

When the server works, a large amount of heat will be generated. If too much heat is accumulated, the performance of the server will be affected. In order to avoid the performance of the server from being affected, the server needs to be cooled.

There are many ways to cool servers in the art, including but not limited to cooling plate liquid cooling and single-phase immersion liquid cooling. For the cooling plate liquid cooling, the heat dissipation effect on local high power consumption devices is good, but the other devices cannot be cooled by the cooling plate liquid cooling, and the cooling plate liquid cooling has the risk of liquid leakage and plate burning. For the single-phase immersion liquid cooling, the cooling liquid is distributed dispersedly, and the heat dissipation effect on local high power consumption devices is poor.

SUMMARY

According to various embodiments, a server and a server liquid cooling system are provided.

According to a first aspect, the server includes a computer case provided with a first liquid cooling cavity, and a first liquid inlet hole and a first liquid outlet hole that are in communication with the first liquid cooling cavity; a high power consumption device and a low power consumption device that are provided in the first liquid cooling cavity; and a cooling plate assembly provided in the first liquid cooling cavity and corresponding to the high power consumption device. The cooling plate assembly is provided with a second liquid cooling cavity, and a second liquid inlet hole and a second liquid outlet hole that are in communication with the second liquid cooling cavity, the second liquid inlet hole is in communication with the first liquid inlet hole, and the second liquid outlet hole is in communication with the first liquid cooling cavity.

In one of the embodiments, the high power consumption device includes a first high power consumption device and a second high power consumption device, and a power consumption of the first high power consumption device is greater than a power consumption of the second high power consumption device. The cooling plate assembly is thermally connected to the first high power consumption device, the second liquid outlet hole faces the second high power consumption device, coolant flows into the second liquid cooling cavity through the first liquid inlet hole and the second liquid inlet hole to perform heat exchange with the first high power consumption device, the heat-exchanged coolant flows into the second high power consumption device through the second liquid outlet hole to perform heat exchange with the second high power consumption device, the heat-exchanged coolant flows into the first liquid cooling cavity through the second liquid outlet hole to perform heat exchange with the low power consumption device, and the heat-exchanged coolant flows out through the first liquid outlet hole.

In one of the embodiments, the cooling plate assembly includes a first liquid cooling portion and a second liquid cooling portion connected to the first liquid cooling portion, the first liquid cooling portion is provided on the first high power consumption device and extends along a first direction, the second liquid cooling portion is provided at an end portion of the first liquid cooling portion along the first direction, the second liquid cooling portion extends along a second direction intersecting the first direction, an end portion of the second liquid cooling portion along the second direction protrudes from a side portion of the first liquid cooling portion along the first direction, the first liquid cooling portion and the second liquid cooling portion cooperatively enclose a receiving space, and the second high power consumption device is received in the receiving space.

In one of the embodiments, the second liquid inlet hole is provided at an end of the first liquid cooling portion away from the second liquid cooling portion, and the second liquid outlet hole is provided at a side of the second liquid cooling portion facing the second high power consumption device.

In one of the embodiments, the first high power consumption device is a central processing unit, and the second high power consumption device is a memory.

In one of the embodiments, the cooling plate assembly includes a bottom plate and a housing having an opening, the bottom plate covers the opening, the bottom plate and the housing cooperatively enclose the second liquid cooling cavity, a side of the bottom plate away from the housing is in contact with the high power consumption device, and the second liquid inlet hole and the second liquid outlet hole are provided on the housing.

In one of the embodiments, the cooling plate assembly further includes a heat dissipation fin provided in the second liquid cooling cavity, and the heat dissipation fin is provided on the bottom plate.

In one of the embodiments, a plurality of heat dissipation fins are provided, the plurality of heat dissipation fins extend along a first direction, and the plurality of heat dissipation fins are spaced apart along a second direction intersecting the first direction.

In one of the embodiments, a height of the heat dissipation fin is 3 mm to 5 mm.

In one of the embodiments, the server further includes a first cooling pipe and a second cooling pipe, one end of the first cooling pipe is in communication with the first liquid inlet hole, another end of the first cooling pipe is in communication with the second cooling pipe, and an end of the second cooling pipe away from the first cooling pipe is in communication with the second liquid inlet hole.

In one of the embodiments, the computer case includes a first side and a second side that are located on opposite sides thereof along a first direction, respectively.

In one of the embodiments, the first liquid inlet hole and the first liquid outlet hole are provided on the first side or the second side.

In one of the embodiments, the first liquid inlet hole is located above or below the first liquid outlet hole in the first direction.

In one of the embodiments, the low power consumption device is provided between the first side and a side of the high power consumption device facing the first side.

In one of the embodiments, the low power consumption device is provided between the second side and a side of the high power consumption device facing the second side.

In one of the embodiments, the high power consumption device is provided at a lower portion of the computer case along a first direction.

In one of the embodiments, the low power consumption device is provided at an upper portion of the computer case along a first direction.

In one of the embodiments, at least two high power consumption devices are provided, and the at least two high power consumption devices are arranged along a first direction, at least two cooling plate assemblies are provided, the at least two cooling plate assemblies are arranged along the first direction, and the at least two cooling plate assemblies are in one-to-one correspondence with the at least two high power consumption devices.

In one of the embodiments, at least two high power consumption devices are provided, and the at least two high power consumption devices are arranged along a second direction, at least two cooling plate assemblies are provided, the at least two cooling plate assemblies are arranged along the second direction, and the at least two cooling plate assemblies are in one-to-one correspondence with the at least two high power consumption devices.

According to a second aspect, a server liquid cooling system includes the aforementioned server and a coolant distribution unit provided with a liquid inlet and a liquid outlet. The liquid inlet is in communication with the liquid outlet, and both the liquid inlet and the liquid outlet are in communication with the cooling plate assembly.

According to the server and the server liquid cooling system operate, when the server operates, the high power consumption device generates a large amount of heat. When the high power consumption device accumulates too much heat, the performance of the server will be affected. Therefore, the server of this embodiment further includes the cooling plate assembly corresponding to the high power consumption device, the heat generated by the high power consumption device will be directly conducted to the cooling plate assembly. Under the action of the coolant distribution unit, the coolant flows into the second liquid cooling cavity through the first liquid inlet hole and the second liquid inlet hole, and the coolant exchanges heat with the cooling plate assembly in the second liquid cooling cavity, so as to reduce the temperature of the cooling plate assembly, thereby reducing the temperature of the high power consumption device. The heat-exchanged coolant flows to the high power consumption device through the second liquid outlet hole, so as to dissipate the heat from the high power consumption device. Then, under the action of gravity, the coolant flows downward and accumulates in the first liquid cooling cavity to form a certain height, so as to immerse the low power consumption device and achieve the heat dissipation of the low power consumption device. Finally, the coolant flows into the coolant distribution unit through the first liquid outlet hole and the liquid inlet hole to be cooled, and the cooled coolant flows into the cooling plate assembly through the liquid outlet hole and the second liquid inlet hole. Such circulation enables the heat dissipation of the high power consumption device and the low power consumption device. In this way, the heat from the high-power-consumption device is first dissipated by a cooling plate liquid cooling mode, and then the heat from the low power consumption device is dissipated by a single-phase immersion liquid cooling mode, so that the heat dissipation requirements of the high power consumption device and the low power consumption device can be satisfied at the same time, and the heat dissipation effect on the high power consumption device can be improved. Since the cooling plate assembly is provided with the second liquid outlet hole, the cooling plate assembly is of an open structure, so that the problems such as liquid leakage and pressure resistance of the cooling plate assembly need not be considered.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

REFERENCE SIGNS

Figure 1:
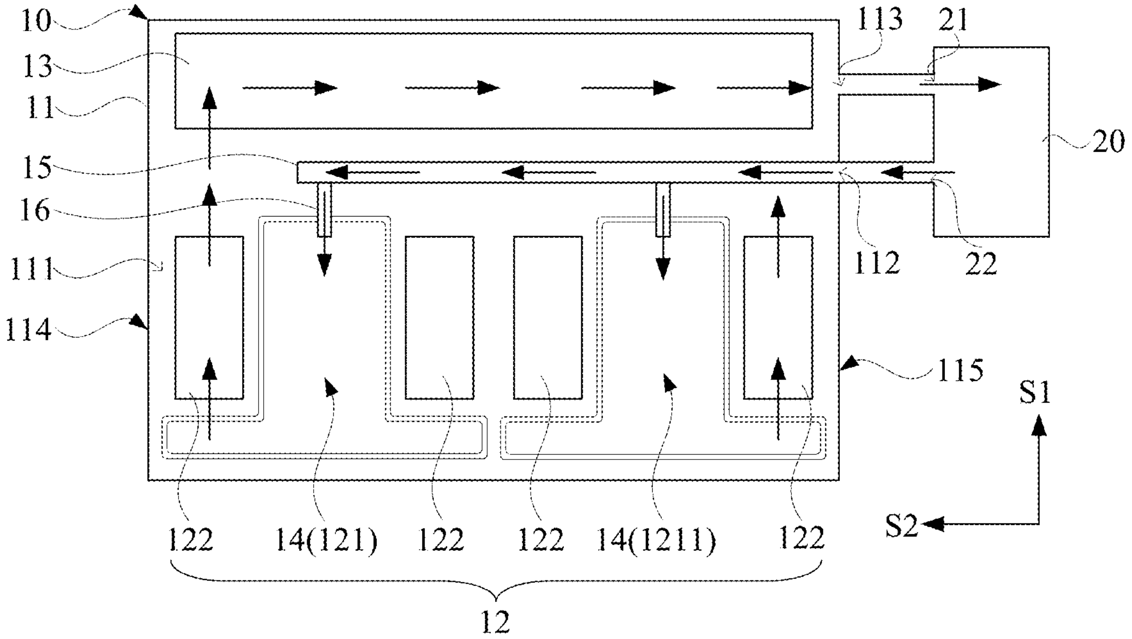
FIG. 1 is a schematic diagram of a server liquid cooling system according to a first embodiment of the present disclosure.

10. Server; 11. Computer case; 111. First liquid cooling cavity; 112. First liquid inlet; 113. First liquid outlet; 114. First side; 115. Second side; 12. High power consumption device; 121. First high power consumption device; 122. Second high power consumption device; 13. Low power consumption device; 14. Cooling plate assembly; 141. Housing; 1411. Second liquid cool cavity; 1412. Second liquid inlet; 1413. Second liquid outlet; 142. Bottom plate; 1421. Heat dissipation fin; 143. Receiving space; 144. First liquid cooling portion; 145. Second liquid cooling portion; 15. First cooling pipe; 16. Second cooling pipe; 20. Coolant distribution unit; 21. Liquid inlet; 22. Liquid outlet; S1, First direction; S2. Second direction.

DETAILED DESCRIPTION OF THE EMBODIMENTS

In order to make the above objects, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counter-clockwise", "axial", "radial", "circumferential direction" are based on the azimuth or position relationship shown in the attached drawings, which are only for the convenience of describing the present disclosure and simplifying the description, rather than indicating or implying that the device or element must have a specific azimuth, be constructed and operated in a specific azimuth, so such terms cannot be understood as a limitation of the present disclosure.

In addition, the terms "first" and "second" are only used for descriptive purposes and cannot be understood as indicating or implying relative importance or implicitly indicating the number of indicated technical features. Thus, the features defined with "first" and "second" may explicitly or implicitly include at least one of the features. In the description of the present disclosure, "a plurality of" means at least two, such as two, three, etc., unless otherwise expressly and specifically defined.

In the present disclosure, unless otherwise expressly specified and limited, the terms "mount", "connect", "contact", "fix" and other terms should be understood in a broad sense, for example, they can be fixed connections, detachable connections, or integrated. They can be mechanical connection or electrical connection. They can be directly connected or indirectly connected through an intermediate medium. They can be the connection within two elements or the interaction relationship between two elements, unless otherwise expressly limited. For those skilled in the art, the specific meaning of the above terms in the present disclosure can be understood according to the specific situation.

In the present disclosure, unless otherwise expressly specified and limited, the first feature "above" or "below" the second feature may be in direct contact with the first and second features, or the first and second features may be in indirect contact through an intermediate medium. Moreover, the first feature is "above" the second feature, but the first feature is directly above or diagonally above the second feature, or it only means that the horizontal height of the first feature is higher than the second feature. The first feature is "below" of the second feature, which can mean that the first feature is directly below or obliquely below the second feature, or simply that the horizontal height of the first feature is less than that of the second feature.

It should be noted that when an element is called "fixed to" or "provided on" another element, it can be directly on another element or there can be a centered element. When an element is considered to be "connected" to another element, it can be directly connected to another element or there may be intermediate elements at the same time. The terms "vertical", "horizontal", "up", "down", "left", "right" and similar expressions used herein are for the purpose of illustration only and do not represent the only embodiment.

Figure 2:
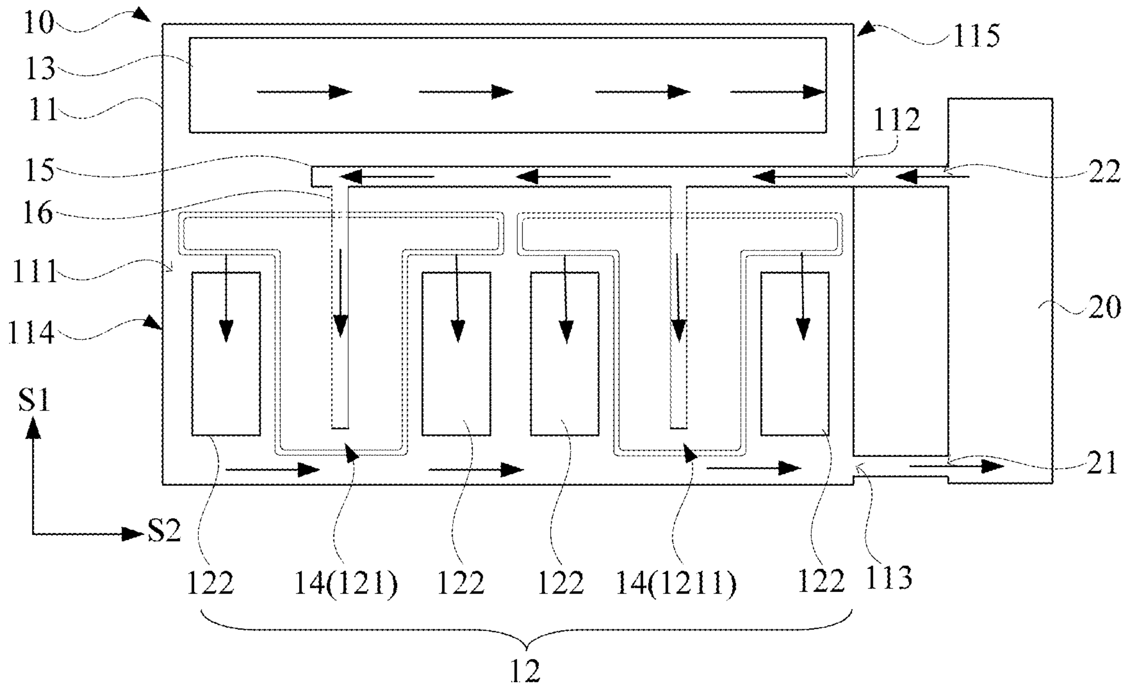
FIG. 2 is a diagram of a server liquid cooling system according to a second embodiment of the present disclosure.
Figure 3:
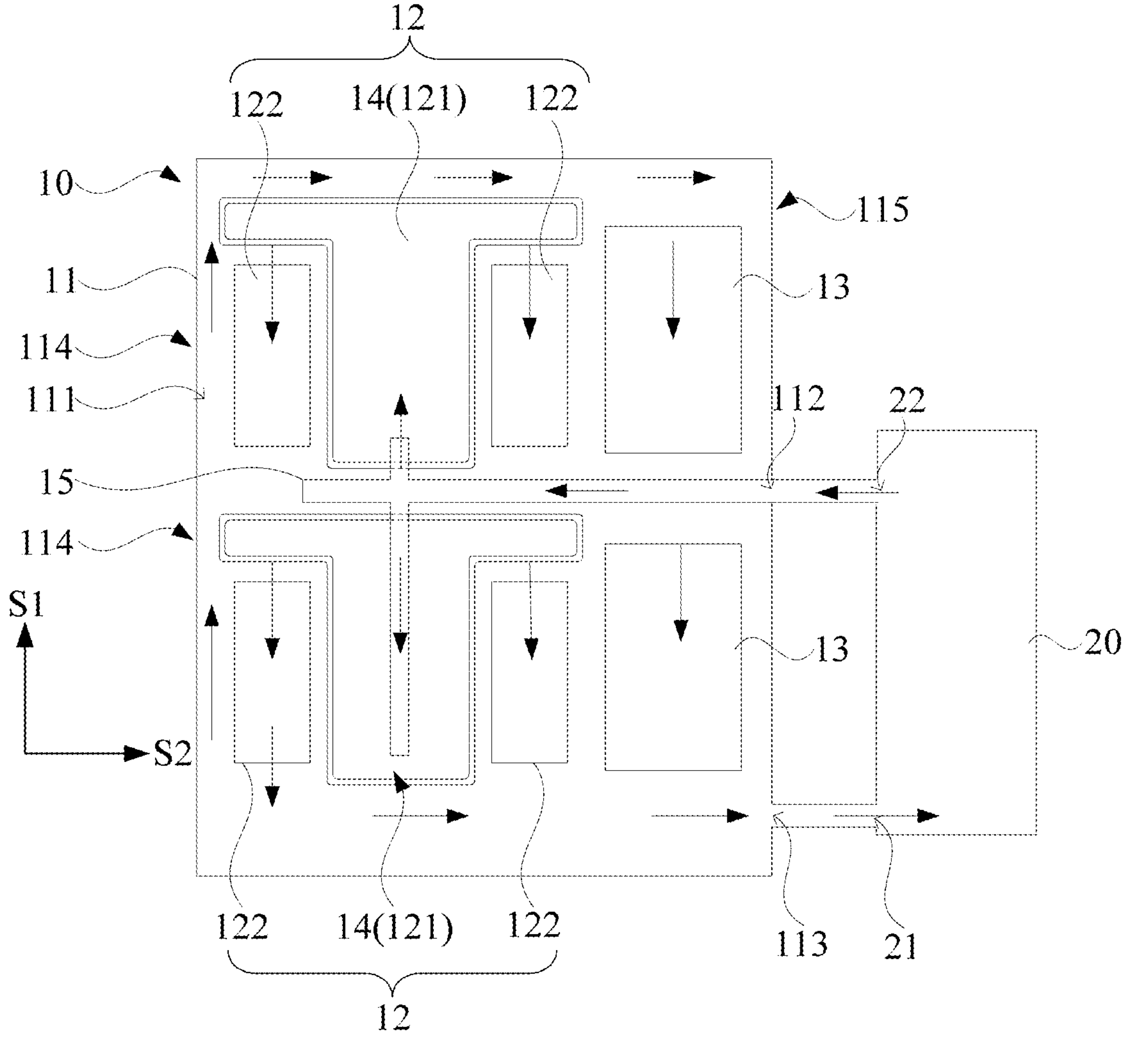
FIG. 3 is a schematic diagram of a server liquid cooling system according to a third embodiment of the present disclosure.

Referring to FIGS. 1 to 3, a server liquid cooling system according to an embodiment of the present disclosure includes a server 10 and a coolant distribution unit (CDU) 20. The coolant distribution unit 20 is provided with a liquid inlet 21 and a liquid outlet 22, the liquid inlet 21 is in communication with the liquid outlet 22, and both the liquid inlet 21 and the liquid outlet 22 are in communication with the server 10.

Further, the coolant distribution unit 20 includes a circulation pump (not shown). Driven by the circulation pump, coolant circulates between the server 10 and the coolant distribution unit 20.

In an embodiment, referring to FIGS. 1 to 3, the server 10 includes a computer case 11, a high power consumption device 12, and a low power consumption device 13. The computer case 11 is provided with a first liquid cooling cavity 111, a first liquid inlet hole 112, and a first liquid outlet hole 113. The first liquid cooling cavity 111 is configured to contain the coolant, and the high power consumption device 12 and the low power consumption device 13 are both provided in the first liquid cooling cavity 111. The first liquid cooling cavity 111 is in communication with the first liquid inlet hole 112 and the first liquid outlet hole 113. The first liquid inlet hole 112 is configured to be in communication with the liquid outlet 22 of the coolant distribution unit 20. The first liquid outlet hole 113 is configured to be in communication with the liquid inlet 21 of the coolant distribution unit 20.

It should be noted that devices in the server 10 are divided into the high power consumption device 12 and the low power consumption device 13 according to the power consumption.

For example, the high power consumption device 12 may be a central processing unit (CPU), Dual-Inline-Memory-Modules (DIMM), etc. provided on a motherboard, and the low power consumption device 13 may be chipsets or capacitors provided on a motherboard. In other embodiments, the high power consumption device 12 and the low power consumption device 13 may also be other devices, which are not limited hereto.

Figure 4:
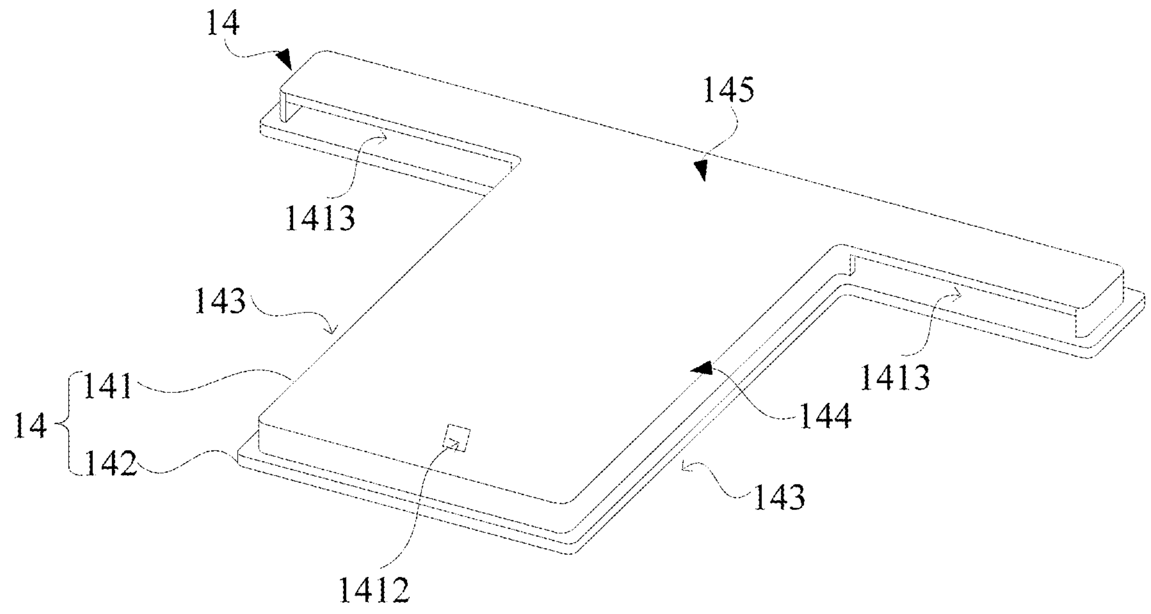
FIG. 4 is a perspective view of a cooling plate assembly according to an embodiment of the present disclosure.
Figure 6:
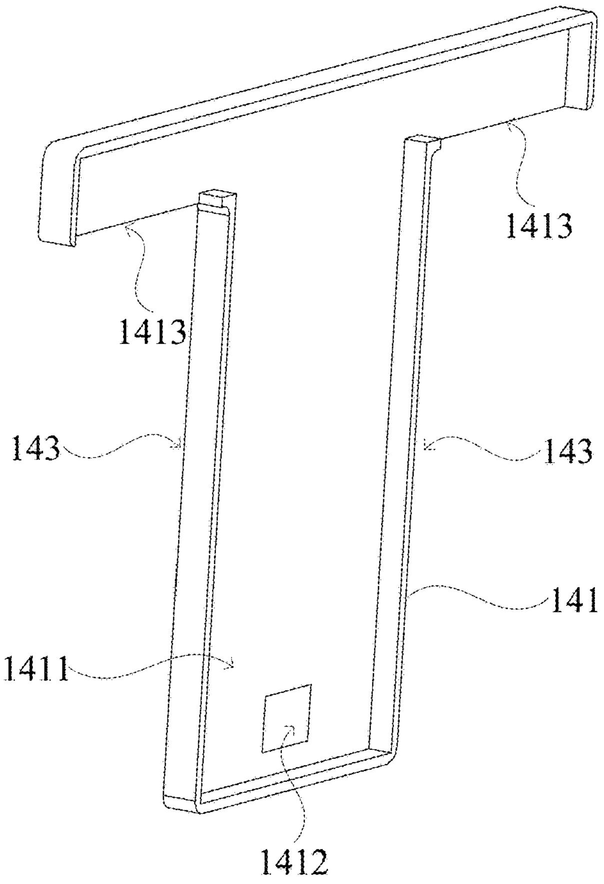
FIG. 6 is a perspective view of the housing of FIG. 5 from another aspect.

Further, referring to FIGS. 1 to 3, the server 10 further includes a cooling plate assembly 14. The cooling plate assembly 14 is provided in the first liquid cooling cavity 111 and corresponding to the high power consumption device 12. Referring to FIG. 4 and FIG. 6, the cooling plate assembly 14 is provided with a second liquid cooling cavity 1411, a second liquid inlet hole 1412, and a second liquid outlet hole 1413. The second liquid cooling cavity 1411 is in communication with the second liquid inlet hole 1412 and the second liquid outlet hole 1413, the second liquid inlet hole 1412 is in communication with the first liquid inlet hole 112, and the second liquid outlet hole 1413 is communication with the first liquid cooling cavity 111.

Specifically, referring to FIG. 1, the server liquid cooling system further includes a first cooling pipe 15 and a second cooling pipe 16. An end of the first cooling pipe 15 is in communication with the first liquid inlet hole 112, the first cooling pipe 15 is in communication with the second cooling pipe 16, and an end of the second cooling pipe 16 away from the first cooling pipe 15 is in communication with the second liquid inlet hole 1412. In this way, a fluid communication between the first liquid inlet hole 112 and the second liquid inlet hole 1412 is achieved.

When the server 10 operates, the high power consumption device 12 accumulates a large amount of heat, and the performance of the server 10 will be significantly affected if the heat cannot be dissipated. Therefore, the server 10 of this embodiment further includes the cooling plate assembly 14 corresponding to the high power consumption device 12, the heat generated by the high power consumption device 12 can be directly dissipated by the cooling plate assembly 14. Due to the coolant distribution unit 20, the coolant can flow into the second liquid cooling cavity 1411 through the first liquid inlet hole 112 and the second liquid inlet hole 1412, and the coolant exchanges heat with the cooling plate assembly 14 in the second liquid cooling cavity 1411, so as to reduce the temperature of the cooling plate assembly 14, thereby reducing the temperature of the high power consumption device 12. The heat-exchanged coolant flows to the high power consumption device 12 through the second liquid outlet hole 1413, so as to dissipate the heat from the high power consumption device 12. Then, under the action of gravity, the coolant flows downward and accumulates in the first liquid cooling cavity 111 to form a certain height, so as to immerse the low power consumption device 13 and achieve the heat dissipation of the low power consumption device 13. Finally, the coolant flows into the coolant distribution unit 20 through the first liquid outlet hole 113 and the liquid inlet hole 21 to be cooled, and the cooled coolant flows into the cooling plate assembly 14 through the liquid outlet hole 22 and the second liquid inlet hole 1412. Such circulation achieves the heat dissipation of the high power consumption device 12 and the low power consumption device 13.

In this embodiment, the heat from the high-power-consumption device 12 is first dissipated by a cooling plate liquid cooling manner, and then the heat from the low power consumption device 13 is dissipated by a single-phase immersion liquid cooling manner, so that the heat dissipation requirements of the high power consumption device 12 and the low power consumption device 13 can be satisfied at the same time, and the heat dissipation effect on the high power consumption device 12 can be improved. Since the cooling plate assembly 14 is provided with the second liquid outlet hole 1413, the cooling plate assembly 14 is of an open structure, so that the problems such as liquid leakage and pressure resistance of the cooling plate assembly 14 will not occur.

In an embodiment, the coolant is non-conductive liquid, such as mineral oil or modified silicone oil. Using the modified silicone oil as the cooling medium can greatly reduce the cost. Since the coolant is not conductive, the problem that the mainboard is damaged due to liquid leakage in the conventional cooling plate liquid cooling mode can be addressed.

In an embodiment, referring to FIG. 1, the high power consumption device 12 includes a first high power consumption device 121 and a second high power consumption device 122. The power consumption of the first high power consumption device 121 is greater than the power consumption of the second high power consumption device 122. For example, the first high power consumption device 121 is a CPU, and the second high power consumption device 122 is a DIMM. In other embodiments, the first high power consumption device 121 and the second high power consumption device 122 may also be other devices, which are not limited hereto.

In an embodiment, referring to FIGS. 1 to 3, the cooling plate assembly 14 is provided on the first high power consumption device 121, and is thermally connected to the first high power consumption device 121. The second liquid outlet hole 1413 faces the second high power consumption device 122. When the server 10 operates, both the first high power consumption device 121 and the second high power consumption device 122 generate heat, and the heat generated by the first high power consumption device 121 is directly conducted to the cooling plate assembly 14. Under the action of the coolant distribution unit 20, the coolant can flow into the second liquid cooling cavity 1411 through the first liquid inlet hole 112 and the second liquid inlet hole 1412 to perform heat exchange with the cooling plate assembly 14 in the second liquid cooling cavity 1411, so as to reduce the temperature of the cooling plate assembly 14, thereby reducing the temperature of the first high power consumption device 121, and the heat dissipation of the first high power consumption device 121 is achieved. After the heat exchange, the coolant in the second liquid cooling cavity 1411 can flow to the second high power consumption device 122 through the second liquid outlet hole 1413, so as to reduce the temperature of the second high power consumption device 122 and achieve heat dissipation of the second high power consumption component 122.

Since the power consumption of the first high power consumption device 121 is greater than the power consumption of the second high power consumption device 122, that is, the heat generated by the first high power consumption device 121 is greater than the heat generated by the second high power consumption device 122, the coolant flows into the cooling plate assembly 14 first, so as to reduce the temperature of the first high power consumption device 121, and prevent the first high power consumption device 121 from affecting the performance of the server 10 due to excessive heat accumulation. After the heat exchange, the coolant in the second liquid cooling cavity 1411 flows out through the second liquid outlet hole 1413. The coolant flowing out through the second liquid outlet hole 1413 is concentrated, has a large flow rate, and a relatively low temperature. Therefore, the coolant flowing out through the second liquid outlet hole 1413 is concentrated to dissipate heat from the second high power consumption device 122, which is conducive to improving the heat dissipation effect on the second high power consumption device 122. In this way, the heat dissipation effect on the first high power consumption device 121 and the second high power consumption device 122 is improved by using the temperature and the flow rate of the coolant properly.

In an embodiment, referring to FIGS. 1 to 3, the cooling plate assembly 14 covers a surface of the first high power consumption device 121, and a size of the cooling plate assembly 14 is greater than or equal to a size of the first high power consumption device 121, so that a heat conduction area between the cooling plate assembly 14 and the first high power consumption device 121 can be increased, and the heat dissipation effect on the first high power consumption device 121 can be improved.

Further, a thermally conductive interface material is provided between the cooling plate assembly 14 and the first high power consumption device 121. In an embodiment, the thermally conductive interface material is, but is not limited to, silicone grease, silica gel, etc. The thermally conductive interface material can fill a micro-gap generated when the cooling plate assembly 14 is in contact with the first high power consumption device 12, thus the thermally conductive contact resistance is reduced, and the heat dissipation effect on the first high power consumption device 121 is improved.

In an embodiment, referring to FIG. 1 and FIG. 4, the cooling plate assembly 14 includes a first liquid cooling portion 144. The first liquid cooling portion 144 extends along a first direction S1, and is provided on the first high power consumption device 121.

Further, referring to FIG. 1 and FIG. 4, the cooling plate assembly 14 further includes a second liquid cooling portion 145 connected to the first liquid cooling portion 144. The second liquid cooling portion 145 is provided at an end portion of the first liquid cooling portion 144 along the first direction S1 and extends along a second direction S2. An end portion of the second liquid cooling portion 145 along the second direction S2 protrudes from a side portion of the first liquid cooling portion 144 along the first direction S1. The first liquid cooling portion 144 and the second liquid cooling portion 145 cooperatively enclose a receiving space 143, and the second high power consumption device 122 is received in the receiving space 143. By providing the second high power consumption device 122 in the receiving space 143, an internal space of the computer case 11 is fully utilized, and the structure of the server 10 is more compact.

Specifically, referring to FIG. 4, the second liquid inlet hole 1412 is provided in the first liquid cooling portion 144. The second liquid inlet hole 1412 is provided at an end of the first liquid cooling portion 144 away from the second liquid cooling portion 145. Since the second liquid inlet hole 1412 is provided in the first liquid cooling portion 144, the coolant is firstly accumulated in the first liquid cooling portion 144 with a certain height, so that the first liquid cooling portion 144 is fully in contact with the first high power consumption device 121 to improve the heat dissipation effect on the first high power consumption device 121. When the height of the coolant reaches the height position of the second liquid outlet hole 1413, the coolant will flow from the second outlet hole 1413 to the second high power consumption device 122. Such arrangement can satisfy the heat dissipation requirements of the first high power consumption device 121 and the second high power consumption device 122, and is conducive to improving the heat dissipation effect on the first high power consumption device 121.

Specifically, referring to FIG. 1 and FIG. 4, the second liquid outlet hole 1413 is provided on a side of the second liquid cooling portion 145 facing the second high power consumption device 122. In this way, the coolant flowing out of the second liquid outlet hole 1413 is concentrated to dissipate heat from the second high power consumption device 122, which is conducive to improving the heat dissipation effect on the second high power consumption device 122.

In an embodiment, a length of the second liquid outlet hole 1413 along the second direction S2 is greater than or equal to a length of the second high power consumption device 122 along the second direction S2. Such arrangement ensures that the flow rate of coolant flowing out through the second liquid outlet hole 1413 is sufficient to dissipate the heat from the second high power consumption device 122.

In an embodiment, referring to FIG. 1, the computer case 11 includes a first side 114 and a second side 115 that are located on opposite sides thereof along the first direction S1, respectively.

Further, referring to FIG. 4, the first liquid cooling portion 144 and the second liquid cooling portion 145 are connected to form a T-shape. Specifically, referring to FIG. 1 and FIG. 4, both ends of the second liquid cooling portion 145 along the second direction S2 protrude from two sides of the first liquid cooling portion 144 along both ends of the first direction S1, respectively. The second high power consumption device 122 is provided in the receiving space 143 enclosed by a side of the first liquid cooling portion 144 facing the first side 114 and the second liquid cooling portion 145, and the second high power consumption device 122 is provided in the receiving space 143 enclosed by a side of the first liquid cooling portion 144 facing the second side 115 and the second liquid cooling portion 145. Both ends of the second liquid cooling portion 145 are provided with second liquid outlet holes 1413 facing the second high power consumption devices 122. With such arrangement, one cooling plate assembly 14 can simultaneously dissipate heat from at least one first high power consumption device 121 and at least two second high power consumption devices 122, which can improve the heat dissipation efficiency.

Figure 5:
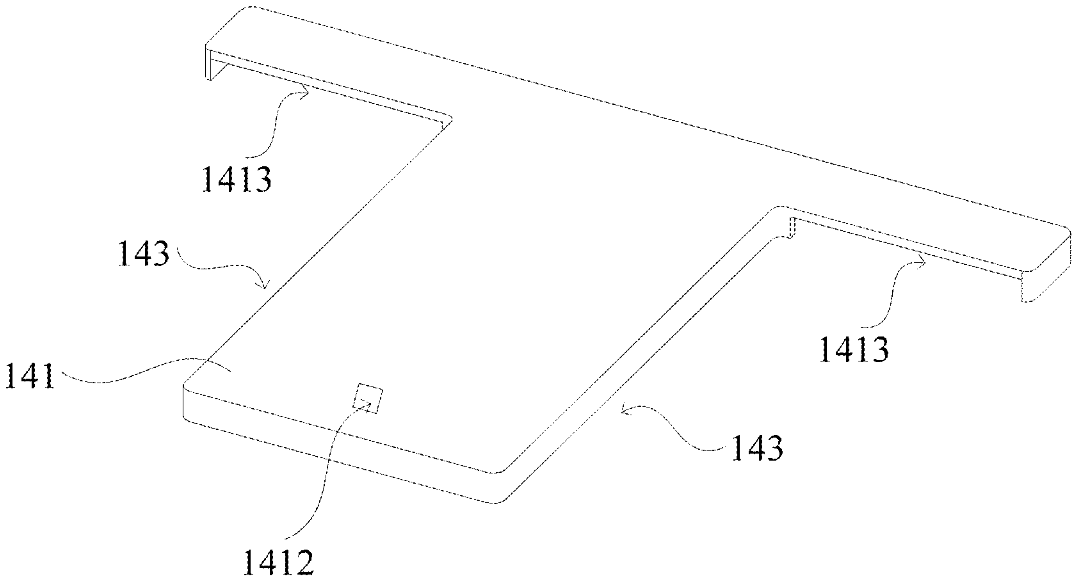
FIG. 5 is a perspective view of a housing shown in FIG. 4.

In an embodiment, referring to FIGS. 4 to 6, the cooling plate assembly 14 includes a bottom plate 142 and a housing 141 having an opening. Optionally, both the bottom plate 142 and the housing 141 are T-shaped. The bottom plate 142 covers the opening of the housing 141, and the bottom plate 142 and the housing 141 cooperatively enclose the second liquid cooling cavity 1411. A side of the bottom plate 142 away from the housing 141 is in contact with the first high power consumption device 121. The second liquid inlet hole 1412 and the second liquid outlet hole 1413 are provided in the housing 141. In other embodiments, the bottom plate 142 and the housing 141 may be integrally formed.

Further, referring to FIG. 4, a size of the bottom plate 142 is greater than a cross-sectional size of the housing 141. Such arrangement facilitates welding of the housing 141 to the base plate 142. In other embodiments, the size of the bottom plate 142 may be equal to the cross-sectional size of the housing 141.

Figure 7:
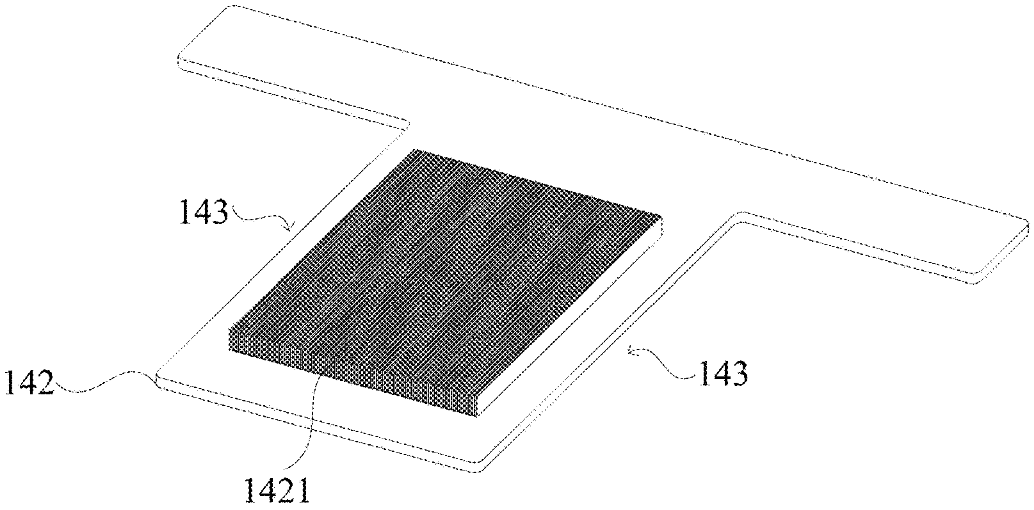
FIG. 7 is a perspective view of a bottom plate shown in FIG. 4.

In an embodiment, referring to FIG. 6 and FIG. 7, the cooling plate assembly 14 further includes a heat dissipation fin 1421 provided in the second liquid cooling cavity 1411. In an embodiment, the heat dissipation fin 1421 is provided on the first liquid cooling portion 144, so that the heat generated by the first high power consumption device 121 can be directly conducted to the heat dissipation fin 1421 for better heat dissipation. In other embodiments, the heat dissipation fin 1421 may also be provided according to the heat distribution of the core of the CPU, which is not limited hereto.

When the server 10 operates, the heat generated by the high power consumption device 12 is conducted to the heat dissipation fin 1421. Under the action of the coolant distribution unit 20, the coolant can flow into the second liquid cooling cavity 1411 through the first liquid inlet hole 112 and the second liquid inlet hole 1412 and is in contact with the heat dissipation fin 1421, so as to dissipate the heat on the heat radiating fin 1421, thereby rapidly reducing the temperature of the cooling plate assembly 14. By providing the heat dissipation fin 1421, a contact area between the coolant and the cooling plate assembly 14 can be increased, and the heat dissipation effect of the cooling plate assembly 14 can be improved. In addition, the heat dissipation fin 1421 is provided in the second liquid cooling cavity 1411, so that interference between the cooling plate assembly 14 and other devices in the first liquid cooling cavity 111 can be prevented while the heat dissipation effect is improved.

Referring to FIG. 7, a plurality of heat dissipation fins 1421 are provided, the plurality of heat dissipation fins 1421 extend along the first direction S1, and the plurality of heat dissipation fins 1421 are spaced apart along the second direction S2. In this way, the coolant can flow in the flow channel between adjacent two heat dissipation fins 1421, so that the heat dissipation fins 1421 are prevented from blocking the flow of the coolant, and the flow speed of the coolant and the heat dissipation effect are ensured.

It should be noted that a thickness of the heat dissipating fin 1421 and a distance between adjacent two heat dissipating fins 1421 can be configured according to the power consumption of the high power consumption device 12 and the heat dissipation requirement, which are not specifically limited herein. If the power consumption of the high power consumption device 12 is large and the heat dissipation requirement is high, the thickness of the heat dissipation fin 1421 can be reduced, and the distance between adjacent two heat dissipation fins 1421 can be reduced.

In one embodiment, a height of the heat dissipation fin 1421 is 3 mm to 5 mm. If the height of the heat dissipation fin 1421 is too large, the heat dissipation fin 1421 will be bent when the coolant flushes the heat dissipation fin 1421. If the height of heat dissipation fin 1421 is too small, the heat dissipation effect of the cooling plate assembly 14 is poor.

In an embodiment, referring to FIG. 1 and FIG. 2, the high power consumption device 12 is provided at a lower portion of the computer case 11 along the first direction S1. The low power consumption device 13 is provided at an upper portion of the computer case 11 along the first direction S1.

In other embodiments, the low power consumption device 13 is provided between the first side 114 and a side of the high power consumption device 12 facing the first side 114. Alternatively, the low power consumption device 13 is provided between the second side 115 and a side of the high power consumption device 12 facing the second side 115.

In an embodiment, at least two high power consumption devices 12 are provided, at least two cooling plate assemblies 14 are provided, and the cooling plate assemblies 14 are in one-to-one correspondence with the high power consumption devices 12. In an embodiment, the high power consumption devices 12 are arranged along the first direction S1, and the cooling plate assemblies 14 are arranged along the first direction S1. Alternatively, the high power consumption devices 12 are arranged along the second direction S2, and the cooling plate assemblies 14 are arranged along the second direction S2.

In an embodiment, the first liquid inlet hole 112 and the first liquid outlet hole 113 are provided on the first side 114. Alternatively, the first liquid inlet hole 112 and the first liquid outlet hole 113 are provided on the second side 115. In an embodiment, the first liquid inlet hole 112 is provided below the first liquid outlet hole 113 in the first direction S1. Alternatively, referring to FIG. 2, the first liquid inlet hole 112 is provided above the first liquid outlet hole 113 in the first direction S1.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A server, comprising:

a computer case provided with a first liquid cooling cavity, and a first liquid inlet hole and a first liquid outlet hole that are in communication with the first liquid cooling cavity;

a high power consumption device and a low power consumption device that are provided in the first liquid cooling cavity; and a cooling plate assembly provided in the first liquid cooling cavity and corresponding to the high power consumption device, wherein the cooling plate assembly is provided with a second liquid cooling cavity, and a second liquid inlet hole and a second liquid outlet hole that are in communication with the second liquid cooling cavity, the second liquid inlet hole is in communication with the first liquid inlet hole, and the second liquid outlet hole is in communication with the first liquid cooling cavity;

wherein the high power consumption device comprises a first high power consumption device and a second high power consumption device, and a power consumption of the first high power consumption device is greater than a power consumption of the second high power consumption device, the cooling plate assembly is thermally connected to the first high power consumption device, the second liquid outlet hole faces the second high power consumption device, such that coolant is capable of flowing into the second liquid cooling cavity through the first liquid inlet hole and the second liquid inlet hole to perform heat exchange with the first high power consumption device, the heat-exchanged coolant flows into the second high power consumption device through the second liquid outlet hole to perform heat exchange with the second high power consumption device, the heat-exchanged coolant flows into the first liquid cooling cavity through the second liquid outlet hole to perform heat exchange with the low power consumption device, and the heat-exchanged coolant flows out through the first liquid outlet hole.

2. The server according to claim 1, wherein the cooling plate assembly comprises a first liquid cooling portion and a second liquid cooling portion connected to the first liquid cooling portion, the first liquid cooling portion is provided on the first high power consumption device and extends along a first direction, the second liquid cooling portion is provided at an end portion of the first liquid cooling portion along the first direction, the second liquid cooling portion extends along a second direction intersecting the first direction, an end portion of the second liquid cooling portion along the second direction protrudes from a side portion of the first liquid cooling portion along the first direction, the first liquid cooling portion and the second liquid cooling portion cooperatively enclose a receiving space, and the second high power consumption device is received in the receiving space.

3. The server according to claim 2, wherein the second liquid inlet hole is provided at an end of the first liquid cooling portion away from the second liquid cooling portion, and the second liquid outlet hole is provided at a side of the second liquid cooling portion facing the second high power consumption device.

4. The server according to claim 1, wherein the first high power consumption device is a central processing unit, and the second high power consumption device is a memory.

5. The server according to claim 1, wherein the cooling plate assembly comprises a bottom plate and a housing having an opening, the bottom plate covers the opening, the bottom plate and the housing cooperatively enclose the second liquid cooling cavity, a side of the bottom plate away from the housing is in contact with the high power consumption device, and the second liquid inlet hole and the second liquid outlet hole are provided on the housing.

6. The server according to claim 5, wherein the cooling plate assembly further comprises a heat dissipation fin provided in the second liquid cooling cavity, and the heat dissipation fin is provided on the bottom plate.

7. The server according to claim 6, wherein a plurality of heat dissipation fins are provided, the plurality of heat dissipation fins extend along a first direction, and the plurality of heat dissipation fins are spaced apart along a second direction intersecting the first direction.

8. The server according to claim 6, wherein a height of the heat dissipation fin is 3 mm to 5 mm.

9. The server according to claim 1, further comprising a first cooling pipe and a second cooling pipe, wherein one end of the first cooling pipe is in communication with the first liquid inlet hole, another end of the first cooling pipe is in communication with the second cooling pipe, and an end of the second cooling pipe away from the first cooling pipe is in communication with the second liquid inlet hole.

10. The server according to claim 1, wherein the computer case comprises a first side and a second side that are located on opposite sides thereof along a first direction, respectively.

11. The server according to claim 10, wherein the first liquid inlet hole and the first liquid outlet hole are provided on the first side or the second side.

12. The server according to claim 10, wherein the first liquid inlet hole is located above or below the first liquid outlet hole in the first direction.

13. The server according to claim 10, wherein the low power consumption device is provided between the first side and a side of the high power consumption device facing the first side.

14. The server according to claim 10, wherein the low power consumption device is provided between the second side and a side of the high power consumption device facing the second side.

15. The server according to claim 1, wherein the high power consumption device is provided at a lower portion of the computer case along a first direction.

16. The server according to claim 1, wherein the low power consumption device is provided at an upper portion of the computer case along a first direction.

17. The server according to claim 1, wherein at least two high power consumption devices are provided, and the at least two high power consumption devices are arranged along a first direction, at least two cooling plate assemblies are provided, the at least two cooling plate assemblies are arranged along the first direction, and the at least two cooling plate assemblies are in one-to-one correspondence with the at least two high power consumption devices.

18. The server according to claim 1, wherein at least two high power consumption devices are provided, and the at least two high power consumption devices are arranged along a second direction, at least two cooling plate assemblies are provided, the at least two cooling plate assemblies are arranged along the second direction, and the at least two cooling plate assemblies are in one-to-one correspondence with the at least two high power consumption devices.

19. A server liquid cooling system, comprising:

the server according to claim 1; and a coolant distribution unit provided with a liquid inlet and a liquid outlet, wherein the liquid inlet is in communication with the liquid outlet, and both the liquid inlet and the liquid outlet are in communication with the cooling plate assembly.

* * * * *